(12) United States Patent
Bishop et al.

(10) Patent No.: US 11,377,740 B2
(45) Date of Patent: *Jul. 5, 2022

(54) NANOFABRICATION USING A NEW CLASS OF ELECTRON BEAM INDUCED SURFACE PROCESSING TECHNIQUES

(71) Applicant: FEI Company, Hillsboro, OR (US)

(72) Inventors: James Bishop, Bondi Junction (AU); Toan Trong Tran, Morrick Ville (AU); Igor Aharonovich, Waterloo (AU); Charlene Lobo, Redfern (AU); Milos Toth, Redfern (AU)

(73) Assignee: FEI Company, Hillsboro, OR (US)

( * ) Notice: Subject to any disclaimer, the term of this patent is extended or adjusted under 35 U.S.C. 154(b) by 75 days.

This patent is subject to a terminal disclaimer.

(21) Appl. No.: 16/709,312

(22) Filed: Dec. 10, 2019

(65) Prior Publication Data

US 2020/0190669 A1 Jun. 18, 2020

Related U.S. Application Data

(62) Division of application No. 14/851,962, filed on Sep. 11, 2015, now Pat. No. 10,538,844.

(51) Int. Cl.
*C23C 16/04* (2006.01)
*C23C 16/48* (2006.01)
*H01J 37/317* (2006.01)

(52) U.S. Cl.
CPC .......... *C23C 16/487* (2013.01); *C23C 16/047* (2013.01); *H01J 37/3174* (2013.01);
(Continued)

(58) Field of Classification Search
CPC ............................ C23C 16/047; C23C 16/487
See application file for complete search history.

(56) References Cited

U.S. PATENT DOCUMENTS 4,673,474 A 6/1987 Ogawa
5,352,330 A * 10/1994 Wallace ................. H01L 21/32
117/108
(Continued)

FOREIGN PATENT DOCUMENTS

EP 2716792 A1 4/2014
JP S6194042 A 5/1986
(Continued)

OTHER PUBLICATIONS

Brandow et al., "Size-Controlled Colloidal Pd(II) Catalysts for Electroless Ni Deposition in Nanolithography Applications", Journal of The Electrochemical Society, Oct. 1997, vol. 144, No. 10, pp. 3425-3434.
(Continued)

*Primary Examiner* — Elizabeth A Burkhart

(57) ABSTRACT

Methods and systems for direct lithographic pattern definition based upon electron beam induced alteration of the surface chemistry of a substrate are described. The methods involve an initial chemical treatment for global definition of a specified surface chemistry (SC). Electron beam induced surface reactions between a gaseous precursor and the surface are then used to locally alter the SC. High resolution patterning of stable, specified surface chemistries upon a substrate can thus be achieved. The defined patterns can then be utilized for selective material deposition via methods which exploit the specificity of certain SC combinations or by differences in surface energy. It is possible to perform all steps in-situ without breaking vacuum.

10 Claims, 12 Drawing Sheets

(52) U.S. Cl.
CPC . *H01J 37/3178* (2013.01); *H01J 2237/31732* (2013.01); *H01J 2237/31754* (2013.01); *H01J 2237/31796* (2013.01)

(56) References Cited

U.S. PATENT DOCUMENTS

| | | | | |
|---|---|---|---|---|
| 2003/0047691 A1* | 3/2003 | Musil | .................. | G03F 1/74 |
| | | | | 250/492.2 |
| 2010/0047532 A1* | 2/2010 | Mozetic | .................. | C08J 7/12 |
| | | | | 428/195.1 |
| 2010/0224592 A1* | 9/2010 | Toth | .................. | H01J 37/3056 |
| | | | | 216/66 |

FOREIGN PATENT DOCUMENTS

| | | | |
|---|---|---|---|
| JP | H02963 A | 1/1990 |
| JP | H0722359 A | 1/1995 |
| JP | 2004119524 A | 4/2004 |

OTHER PUBLICATIONS

Marrian et al., "Low voltage electron beam lithography in self-assembled ultrathin films with the scanning tunneling microscope", Applied Physics Letters, Jan. 17, 1994, vol. 64, No. 3, pp. 390-392.

* cited by examiner

NANOFABRICATION USING A NEW CLASS OF ELECTRON BEAM INDUCED SURFACE PROCESSING TECHNIQUES

This application is a divisional of U.S. application Ser. No. 14/851,962, filed Sep. 11, 2015, which is incorporated herein by reference in its entirety.

FIELD OF THE INVENTION

The present invention relates to improved electron beam processing techniques, especially improved techniques for fabrication at nano-scale resolutions.

BACKGROUND

Electron beam induced deposition (EBID) is a technique used to deposit material on a substrate surface. EBID deposits material on the substrate surface through interaction of the electron beam and a deposition precursor. Often, the precursor is a gas and the material to be deposited is a metal.

Electron beam induced etching (EBIE) is another technique for modification of the surface of a substrate. In EBIE, the electron beam induces etching in the irradiated areas, often assisted by an etching precursor gas.

Electron beam induced deposition is appealing because it enables direct-write nano-fabrication and high resolution visual feedback in a scanning electron microscope (SEM). However, the current applications of EBID are limited.

Applications of EBID have been limited by several problems. Typically, material deposited by EBID suffers from low purity of the intended deposit, causing problems such as high electrical resistance relative to purer deposits. Materials deposited by EBID also tend to have an unfavorable nano/micro-structure, for example, the materials are often polycrystalline. Another limitation of EBID involves the limited number of materials or compounds that can currently be deposited. Deposition of a particular material requires a suitable deposition precursor, which does not exist for some materials. An EBID precursor must react in the presence of the electron beam to form a non-volatile component of the material to be deposited and a volatile portion of material in the compound that is not to be deposited, yet must not react spontaneously with the surface in the absence of the beam. The precursor molecules must adhere to the surface sufficiently to allow the beam to interact, yet not condense on the surface to form a thick layer that obscures the surface.

Material may also be deposited by other techniques, such as chemical vapor deposition (CVD), wet chemistry techniques, and other methods. Such methods are limited by the minimum feature size on which selective deposition can be performed.

One application of EBID is direct write, single step electron beam lithography. Conventional electron beam lithography (EBL) uses an electron irradiation sensitive resist layer which is selectively removed (positive resist), or not removed (negative resist) by a development step following irradiation to define the lithographic pattern. Material is then deposited globally, and the resist removed, leaving deposits only in areas where the resist was removed during development.

The resolution of EBL is limited by the size of the electron beam interaction volume within the resist layer, and the attainable resolution improves with decreasing resist layer thickness. At the limit of very thin resist layers, there are significant practical problems with properly removing the layer to leave well defined, high resolution features after the fabrication step. Multi-step processing with EBL is very difficult due to the multiple resist coating and removal steps involved. Resist layers also tend to obscure alignment marks upon substrates, adding another difficulty to multi-step EBL.

Marbach, "Electron beam induced surface activation: a method for the lithographic fabrication of nanostructures via catalytic processes," Applied Physics A, Vol. 117, Issue 3, pp. 987-995 (2014), describes a two-step method for deposition on a substrate. Marbach activates a surface without the presence of precursor molecules, followed by deposition of material on the activated areas in a separate step. This method is limited in application because of the limited number of materials that can be grown on areas activated without the use of a precursor gas. In addition, the method of Marbach is not applicable to iterative deposition, needed to fabricate complex, multi-component materials and devices.

Another process for two-step deposition is described by Mackus et al, "Local deposition of high-purity Pt nanostructures by combining electron beam induced deposition and atomic layer deposition," J. Appl. Physics, Vol. 107, 116102-116102-3 (2010). In Mackus, a substrate is activated by depositing a seed layer of platinum by EBID, followed by selective atomic layer deposition of platinum on the seed layer. While this two-step process provides selective growth of platinum, the process is limited in the materials that can be grown on metallic seed layers. The process is also limited in terms of iterative application of the technique, which is needed to fabricate complex, multi-component structures.

Randolph et al, "Local deposition of high-purity Pt nanostructures by combining electron beam induced deposition and atomic layer deposition," Particle, Vol. 30, pp. 672-677 (2013), describes a method for deposition of platinum by electron beam fluorination of a surface, followed by a CVD step in which $Pt(PF_3)_4$ and $XeF_2$ precursors are mixed to achieve localized deposition of Pt on the fluorinated surface. It is not known whether this process can be used for the deposition of materials other than polycrystalline, porous Pt.

Djenizian et al, "Electron-Beam Induced Nanomasking for Metal Electrodeposition on Semiconductor Surfaces," *J. Electrochem. Soc.*, Vol. 148, Issue 3, pp. C197-C202, describes a method for creating a "negative resist" by EBID of carbon on a substrate using residual hydrocarbon contamination in an SEM system. The carbon deposited by EBID selectively blocks the electrodeposition of Au in a subsequent step. The method of Djenizian is limited in application for the same reasons as Mackus above.

What is needed are improved techniques for selective nano-deposition of high quality, functional materials with improved resolution, ease of fabrication, fewer processing steps, and the ability to perform multiple processing cycles.

SUMMARY

An object of the invention is to provide improved electron beam processing.

The invention provides methods and systems for direct lithographic pattern definition based upon electron beam induced alteration of the surface chemistry of a substrate, such as silicon, an oxide or noble metal substrate. Provided are methods for nanoscale surface chemistry based direct electron beam lithography (SCDEBL). The methods involve an initial chemical treatment for global formation of a specified surface chemistry (SC) on a workpiece. Electron beam induced surface reactions between a gaseous precursor and the surface are then used to locally alter the SC in a second workpiece surface modification step. High resolution patterning of stable, specified surface chemistries upon a substrate can thus be achieved in a number of steps. The defined patterns can then be utilized for selective material fabrication or deposition via methods which exploit the specificity of certain SC combinations or by differences in surface energy. In some embodiments, all steps may be performed in-situ without breaking vacuum. Various embodiments enable increases in the ultimate resolution capabilities and ease of fabrication at high resolution of EBL based nanofabrication techniques as well as decreases in the number of required processing steps.

Preferred versions achieve the initial global surface chemistry modification and the second local surface chemistry modification by controlling surface termination (rather than by, for example, depositing a seed metallic layer by EBID). The process can be optimized by maximizing the difference between the surface energy of passivated and activated surface regions.

One embodiment provides a method of charged particle beam processing of selective areas of a surface, the method conducted on a workpiece which may be in situ in the sample chamber of an electron beam system, or may have steps conducted ex situ. The method includes performing a first workpiece surface modification, the first workpiece surface modification activating or passivating broad, delocalized regions on the workpiece surface. Then the method includes introducing a precursor gas into the sample chamber and performing a second workpiece surface modification using an electron beam in the presence of the precursor gas, the second workpiece surface modification activating or passivating specific, localized regions on the workpiece surface. One of the first or second workpiece surface modifications is a surface activation and one being a surface passivation. Next, the method affixes material to the activated regions on the workpiece surface.

In some versions, the first workpiece surface modification is surface activation and the second workpiece surface modification is selective surface passivation. In other versions, the first workpiece surface modification is surface passivation and the second workpiece surface modification is selective surface activation. Some versions may iterate the process or cyclically repeat the steps of: performing first and second workpiece surface modifications; one of the first or second workpiece surface modifications being a surface activation; and affixing material to activated regions on the workpiece surface. In some iterations, the process may vary whether the workpiece surface activation step is the first or second workpiece surface modification for subsequent workpiece surface processing cycles.

Some embodiments perform the first workpiece surface modification in an in-situ process, while some employ an ex-situ process. In some embodiments, affixing material to the activated regions on the workpiece surface includes growing a deposition on the activated regions of the workpiece surface. This may include growing a deposition on the activated regions of the workpiece surface by chemical vapor deposition, or may include growing a deposition on the activated regions of the workpiece surface by a wet process in which deposition nucleation only occurs on activated regions on the workpiece surface. In some embodiments, affixing material to the activated regions on the workpiece surface comprises attaching nanoparticles or specific molecules to the workpiece surface.

In some embodiments, the first workpiece surface modification includes forming a self-assembled monolayer on the workpiece surface. In some embodiments, the second workpiece modification further includes altering the surface with a resolution smaller than full width half maximum (FWHM) size of the electron beam. In some embodiments, one or both of the first and second workpiece surface modifications comprises modification of surface termination properties. In some embodiments, the first workpiece surface modification includes depositing a monolayer on the workpiece surface, and the second workpiece surface modification comprises selective removal of the monolayer.

An apparatus for charged particle beam processing of selective areas of a work piece is also provided, the apparatus including a sample chamber with a sample stage; one or more charged particle beam columns for directing charged particle beam or beams toward the workpiece; a precursor gas source for introducing precursor gas into the sample chamber, the precursor gas being used for beam-induced surface modification; a system for affixing material to the activated regions on the workpiece surface; a controller for controlling operation of the charged particle beam system and the system for affixing material to the activated regions on the workpiece surface, the controller comprising one or more processors for executing computer instructions and non-transitory computer memory storing instructions for performing steps including: receiving a workpiece upon which a first workpiece surface modification has been performed; introducing a precursor gas into the sample chamber; performing a second workpiece surface modification using an electron beam in the presence of the precursor gas, the second workpiece surface modification applied to specific, localized regions on the workpiece surface; one of the first or second workpiece surface modifications being a surface activation and one being a surface passivation; and affixing material to the activated regions on the workpiece surface.

In various embodiments, the apparatus may further be programmed with instructions for performing the various method steps discussed above. In some embodiments, the non-transitory computer memory stores additional instructions for cyclically repeating the steps of performing first and second workpiece surface modifications, one of the first or second workpiece surface modifications being a surface activation, and affixing material to activated regions on the workpiece surface. In some embodiments, the non-transitory computer memory stores additional instructions for using different processes for one or more of the first workpiece surface modification, the second workpiece surface modification, and affixing material to the activated regions on the workpiece surface for subsequent workpiece surface processing cycles. In some embodiments, the non-transitory computer memory stores additional instructions for affixing material to the activated regions on the workpiece surface, including: growing a deposition on the activated regions of the workpiece surface. In some embodiments, the non-transitory computer memory stores additional instructions for affixing material to the activated regions on the workpiece surface, including: attaching nanoparticles to the workpiece surface.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present disclosure, and advantages thereof, reference is now made to the following descriptions taken in conjunction with the accompanying drawings, in which.

DETAILED DESCRIPTION

Described below are several techniques for using electron beam induced chemical reactions to define nanoscale regions of altered surface chemistry (SC) upon an oxide or noble metal substrate. Some of the systems described enable increases in the ultimate resolution capabilities and ease of fabrication at high resolution of EBL based nanofabrication techniques as well as decreases in the number of required processing steps.

Figure 1A:
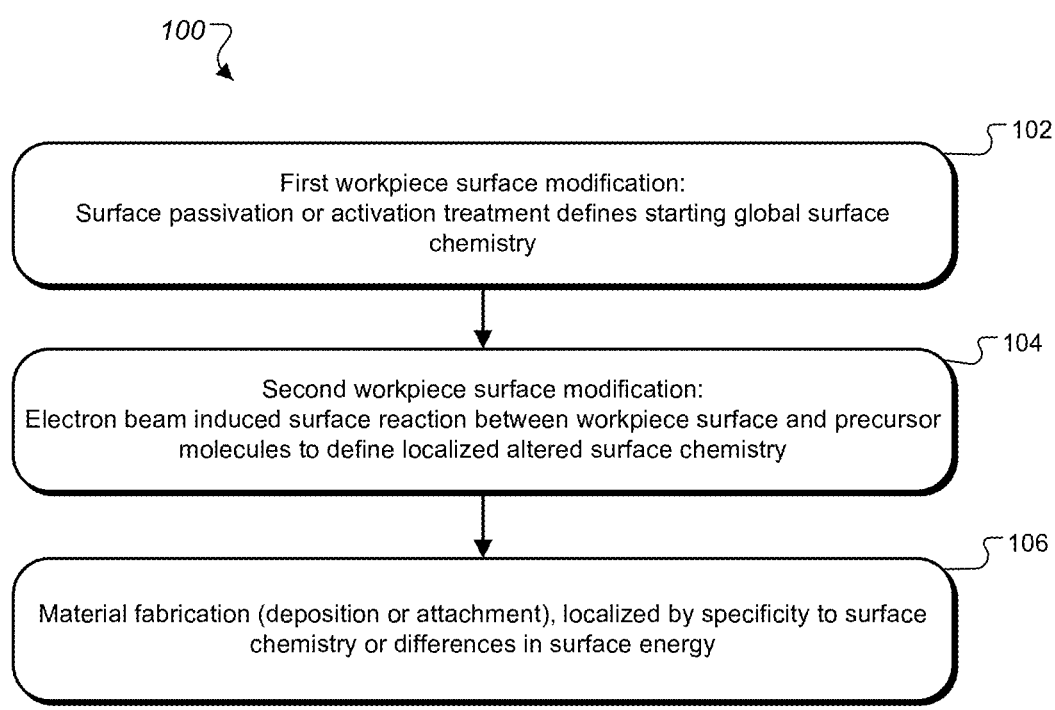
FIG. 1A is a flowchart of a generalized process for performing a method in accordance with some embodiments.
Figure 1B:
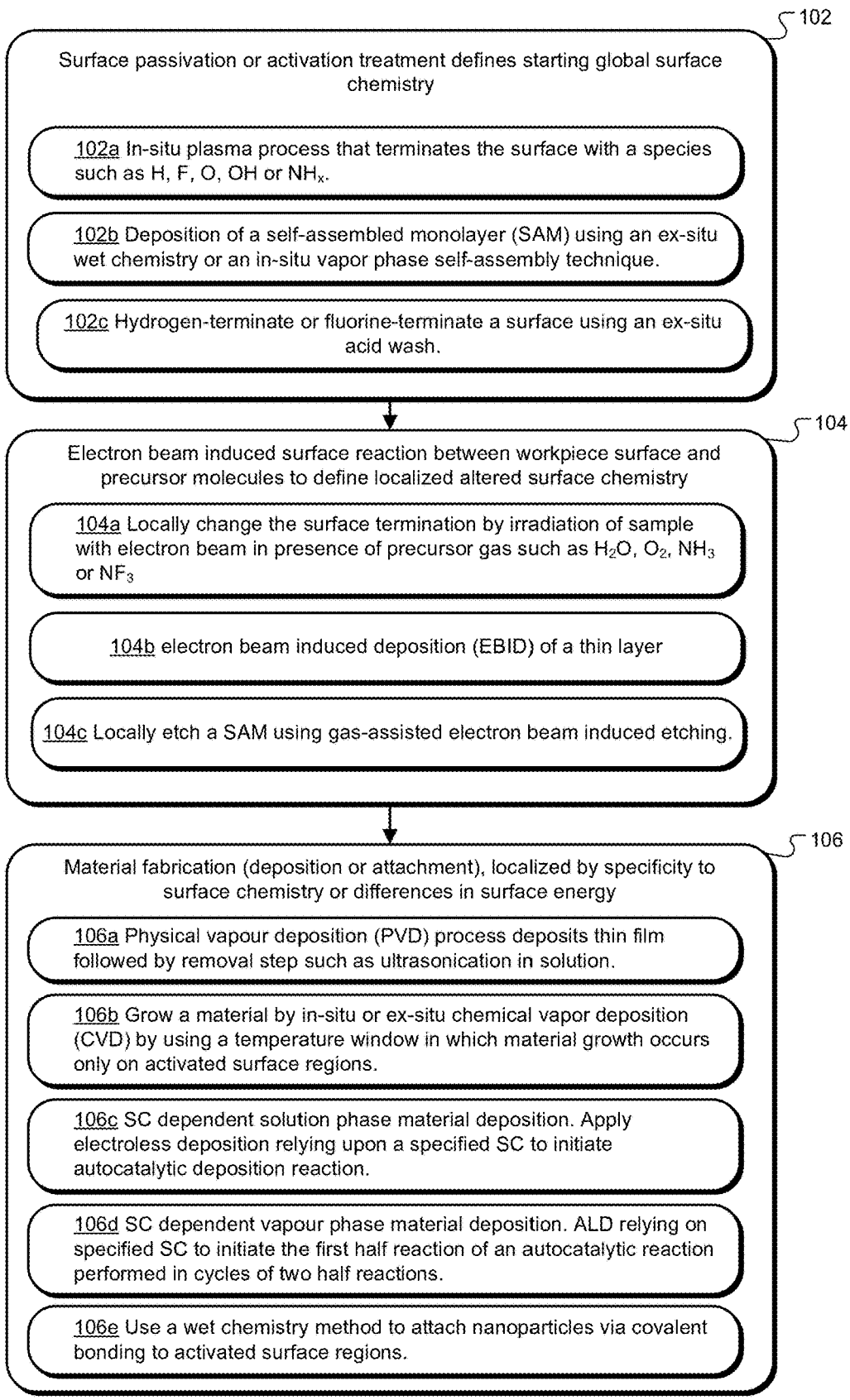
FIG. 1B is a flowchart showing some alternative techniques for the blocks of FIG. 1A.

FIG. 1A is a flowchart of a generalized process for performing a method in accordance with some embodiments. FIG. 1B is a flowchart showing some example alternative techniques for the blocks of FIG. 1A. Referring to both Figures, provided generally is a processing scheme for nanoscale surface chemistry based direct electron beam lithography (SCDEBL). The scheme preferably consists of three main processing steps, and employs electron beam induced surface reactions between a gaseous precursor molecule and a specific substrate surface. This mechanism, as well as the absence of a resist stripping step following the fabrication process, and increased applicability to iterative multi-step processing helps provide improvements from conventional EBL. This contrasts with many conventional resist-based EBL processes, which rely upon electron irradiation induced reactions within a resist layer without a gaseous precursor.

The process 100 in this embodiment includes three main steps, and begins at block 102 with a first modification of the surface chemistry of the workpiece, preferably using a chemical treatment to define a particular global SC upon the substrate. This may be a solution or gas phase based reaction between a clean substrate surface and chemical species. The treatment may be a single reaction or a series of reactions to result in a defined SC. This modification is performed on a large region relative to the size of the area in which subsequent electron beam processing is to be performed, such that the entirety of the area where electron beam processing is to be performed on has been modified. The surface modification may be either an activating or a passivating modification.

Referring to FIG. 1B, specific alternative examples for techniques of block 102 are shown. In Block 102a, it uses an in-situ plasma process that terminates the surface with a species such as H, F, O, OH or $NH_x$. Or, in block 102b, the process performs deposition of a self-assembled monolayer (SAM) using an ex-situ wet chemistry or an in-situ vapor phase self-assembly technique. Another alternative in block 102c is to hydrogen-terminate or fluorine-terminate a surface using an ex-situ acid wash.

Referring again to FIG. 1A, next, in block 104, irradiation by a focused electron beam is used to induce a reaction between precursor molecules and the workpiece surface as modified in block 102. The reaction between the precursor molecules and the workpiece surface serves to alter the previous modification. Generally this block includes an electron beam processing step in the presence of a specific gaseous precursor species in a vacuum chamber to define a pattern of altered SC upon the substrate. Electron irradiation induces surface reactions between the precursor molecules and the substrate surface. The second workpiece modification may include altering the surface with a resolution smaller than full width half maximum (FWHM) size of a Gaussian electron beam.

Some non-limiting examples of suitable techniques for performing block 104 are shown in FIG. 1B, blocks 104a and 104b. At option 104a, the process may locally change the surface termination by irradiation of the sample by an electron beam in the presence of a precursor gas such as $H_2O$, $O_2$, $NH_3$ or $NF_3$. Such surface alteration is limited to regions which are subject to a threshold irradiation dose. The electron irradiation induced surface reaction (EIISA) could be limited to alteration of the surface termination of the substrate (i.e. a single atomic layer). As shown at option 104b, the process may employ electron beam induced deposition (EBID) of a thin layer. Or, at block 104c, the process may locally etch a SAM using gas-assisted electron beam induced etching.

Next, in block 106, a material fabrication step is conducted in which material is deposited or attached to areas localized by their surface chemistry or relative difference in surface energy. For example, if the surface were activated in block 102, then selected regions on the surface were passivated in block 104, material may be deposited in block 106 on the remaining activated areas on the surface, without substantial deposition on the areas passivated in block 104. Some non-limiting examples of techniques for this step are shown at blocks 106a, 106b, 106c, 106d, and 106e.

At block 106a, the process may include a physical vapour deposition (PVD) process to deposit a thin film followed by a removal step such as ultrasonication in solution. Differences in adhesion strength between different regions of SC then allow the process to selectively remove the film. At block 106b, the process may grow a material by in-situ or ex-situ chemical vapor deposition (CVD) by using a temperature window in which material growth occurs only on activated surface regions. Such a CVD process may rely upon a surface catalysed reaction of adsorbed gaseous precursor molecules. The different SC's created at block 104 result in different CVD growth rates among various regions. This can result in localised CVD growth with optimised conditions. The next option shown at block 106c is a SC dependent solution phase material deposition process. This block may use a process of electroless deposition relying upon a certain SC to initiate an autocatalytic deposition reaction. Another alternative at block 106d is to grow a material using an in-situ SC dependent vapour phase material deposition process in which nucleation happens only on activated surface regions. This block performs atomic layer deposition (ALD) relying upon a specified SC to initiate the first half reaction of an autocatalytic reaction performed in cycles of two half reactions. Another option, as shown at block 106e, the process may use a wet chemistry method to attach nanoparticles (e.g. quantum dots) via covalent bonding to activated surface regions. This provides a SC dependent solution based molecular attachment process. The electron beam induced patterns of a certain SC can be applied to covalently bond biomolecules, nanoparticles, nanowires, nanotubes, nanoribbons or other nanostructures or molecules through appropriate chemical reactions.

As one of ordinary skill in the art will recognize in view of the present specification, there are many possible combinations of possible methods for surface modifications for each block. Further, as can be understood from the description below, the process may be iterated or repeated, with variations, to produce complex structures with multiple layers.

Figure 2:
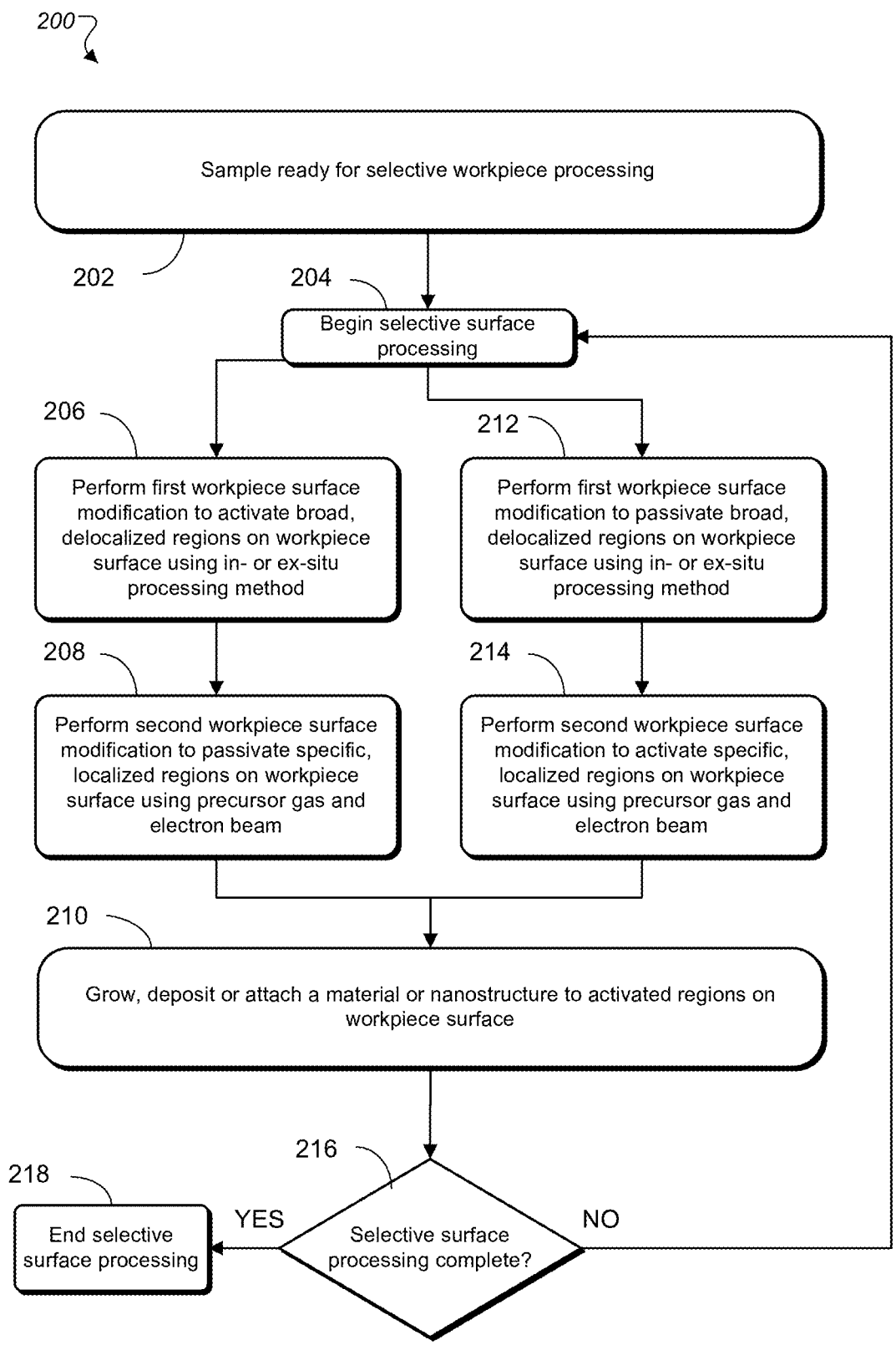
FIG. 2 is a flowchart showing another embodiment of the invention.

FIG. 2 shows a flow chart of a process 200 according to another embodiment. The depicted flowchart provides an iterative process employing the steps discussed above. As shown, various iterations may begin with activation, or with passivation, of the workpiece surface. Some versions may begin following the left hand depicted branch with activation first, then iterating through the right hand depicted branch employing passivation first. Some processes may do the opposite. The same branch may also be repeated more than once in a row. As shown, the process begins at block 202, where a workpiece is prepared for selective surface processing, which begins in block 204.

The process may then continue with block 206, in which a first workpiece surface modification is performed to activate the surface for material deposition in a later block. The first workpiece surface modification is applied to a relatively large area of the surface, and may use suitable technique as described in reference to block 102 above. In block 208, a second workpiece surface modification is applied to the sample surface using a precursor gas, using any suitable technique as described with respect to block 104 above. The precursor gas is decomposed in the presence of the electron beam to alter the surface modification applied in block 206 so as to passivate the surface. Because the second workpiece surface modification is performed with an electron beam, the minimum feature size is very small and the surface modification can be localized to specific areas with great accuracy and precision. The decomposition of the precursor gas and associated gas-assisted surface modification may also only occur where the beam dose is higher than a threshold value, allowing further control of the areas in which modification is to be performed. The surface alteration may be an alteration of the surface energy, the chemical functionality of the surface, the oxidation state of the surface, the presence of a self-assembled monolayer on the surface, or any other technique for altering the surface properties in relation to later deposition of material.

Referring back to block 204, rather than proceeding to block 206 in the first, or any subsequent iteration, the process may go to the right hand depicted branch starting at block 212. Blocks 212 and 214 are similar to blocks 206 and 208, except in block 212, the large-area surface modification is a passivation step, and in block 214, the localized surface modification is an activation step.

Following either block 208 or 214 is block 210. In block 210, material is either grown, deposited, or attached to activated areas on the workpiece surface using any suitable technique such as those described above with respect to block 106. The material may be a metal, a semiconductor, an insulator, nanostructures such as quantum dots, or other materials. In various embodiments, the material may be deposited by physical vapor deposition (PVD), chemical vapor deposition (CVD), a solution phase material deposition process, an autocatalytic deposition process, atomic layer deposition (ALD), a molecular attachment process, or any other material deposition process which allows deposition to occur with selectivity based on the workpiece surface properties.

After material has been grown, deposited, or attached to the workpiece surface, the process continues with decision block 216. If selective surface processing is complete, the process terminates with block 218. If selective surface processing is not complete, the process may return to block 204 to begin another workpiece surface modification and material growth/attachment cycle. Subsequent cycles may employ different techniques for each step and/or deposit different materials, or be the same as a previous cycle, or combinations of such.

Compared to conventional, resist-based EBL, it can be understood in view of this specification that the SCDEBL processes provided herein have several advantages. Resolution capabilities (minimum feature widths) may be improved. Achieving very high resolution material deposition with conventional EBL requires the use of very thin resist layers which introduces several practical problems, e.g. thin resist layers tend to break during the lift-off step. Further, the SCDEBL techniques herein typically rely upon direct surface reaction induced by an electron beam and adsorbed precursor molecules. This enables scenarios that create sub beam diameter surface alteration (for a focused electron beam with gaussian profile, diameter taken as full width half maximum (FWHM) of profile). This is enabled because a threshold electron dosage will exist for sufficient surface alteration, and regions receiving a lower electron flux may remain "inactivated." Thus the techniques herein provide ways to alter the surface in a region smaller than FWHM of the focused electron beam profile.

The techniques herein also provide advantages with where multi-step processing is needed. Multi-step processing with conventional EBL, which typically involves multiple resist coating and removal steps, can be prohibitively difficult. Further, alignment marks upon the substrate are often obscured by resist layers, adding further steps or difficulties to multi-step processing using conventional EBL. With SCDEBL, the substrate surface itself takes the role of the resist layer, and as long as the surface chemistry remains unaltered, further patterning steps should be possible. For the processes described herein, no resist layer is typically needed, and therefore alignment marks are not obscured.

Figure 4A:
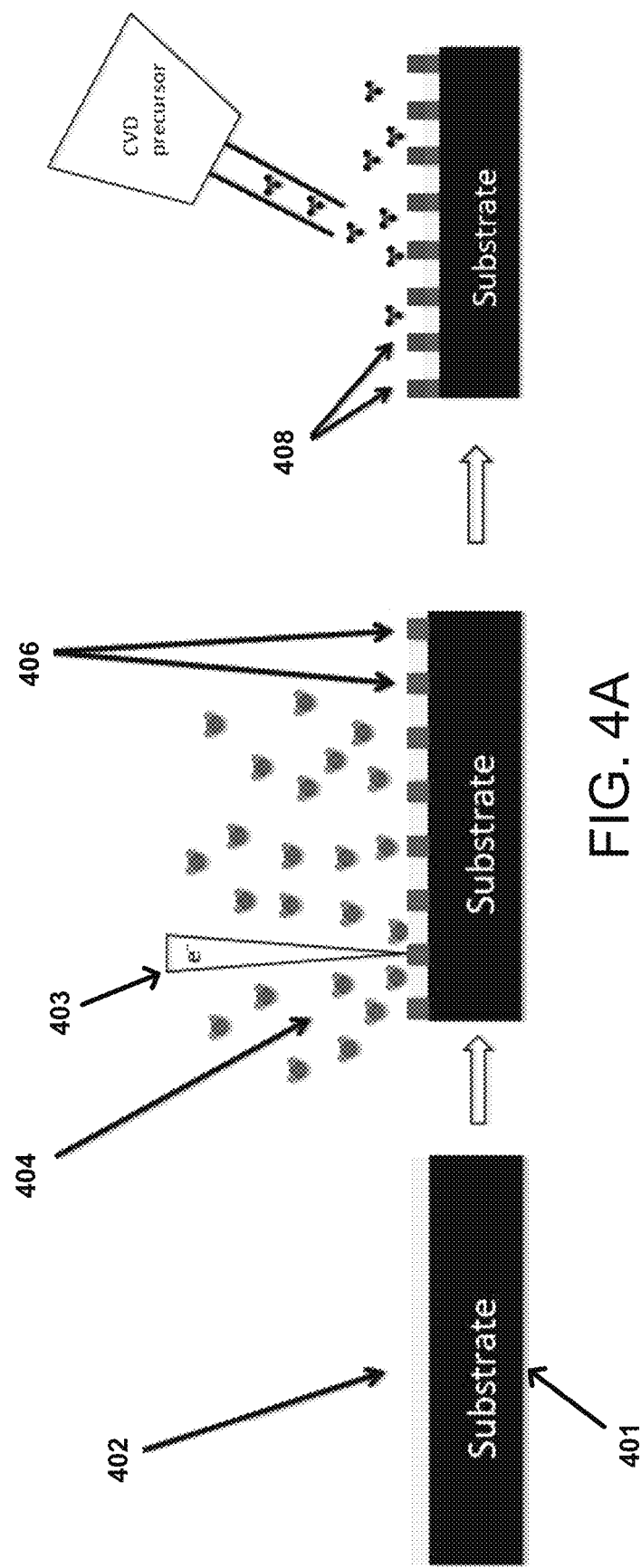
FIG. 4A shows a sequential series of workpiece cross-sectional diagrams illustrating an example SCDEBL process according to one embodiment.

FIG. 4A shows a sequential series of workpiece cross-sectional diagrams illustrating an example SCDEBL process according to one embodiment. The first workpiece surface chemistry modification is performed as shown by the surface treatment 402, used to globally define a certain global surface chemistry for a workpiece substrate 401. Next, the second workpiece surface chemistry modification is performed as an electron beam 403 irradiation in the presence of precursor molecules 404 induces a reaction between a gaseous precursor molecules 404 and substrate 401, the beam 403 being directed along the substrate surface to create a pattern of nanoscale regions 406 of altered surface chemistry (SC) resulting from beam-induced reactions. This high resolution pattern of altered SC can then localise subsequent SC dependent material fabrication processes. The next cross section shows the material fabrication process with localized regions 408 with higher rates of Chemical Vapour Deposition (CVD) from the CVD precursor, creating the structure 408 atop the pattern 406. It is noted differing deposition rates upon different surfaces of different energy, and in some versions the deposited structures may appear atop the non-patterned area (a reverse pattern) depending on whether the pattern is formed with passivation or activation as described above.

Figure 4B:
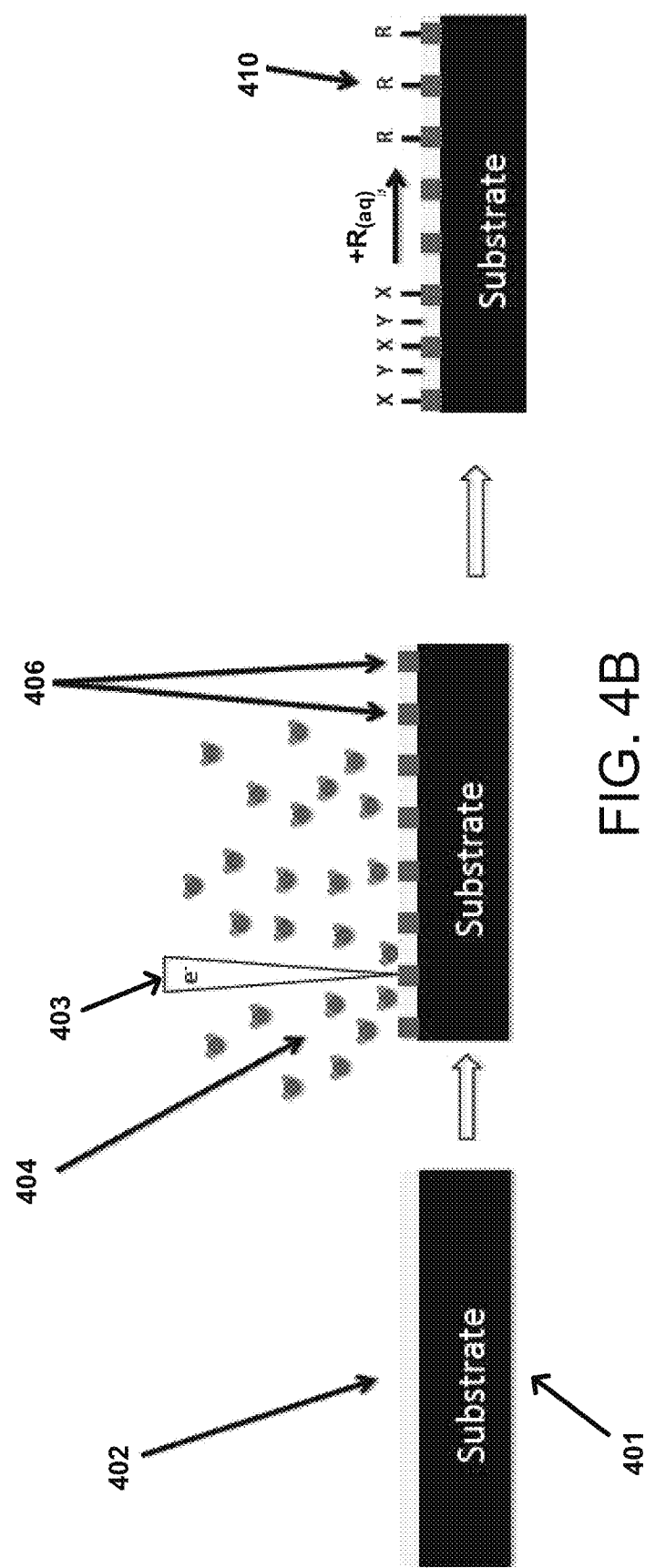
FIG. 4B shows a similar set of sequential series of diagrams illustrating another example SCDEBL process according to another embodiment.

FIG. 4B shows a similar set of sequential series of diagrams illustrating another example SCDEBL process according to another embodiment. The first two steps are the same as described with respect to FIG. 4A. The third step of material fabrication performs covalent attachment of chemical species using subsequent reactions which are specific to a certain SC. As shown, the reagent in aqueous solution $R_{(aq)}$ is passed over the patterned workpiece substrate surface, causing a bond of the reagent R to the surface in the patterned area, thereby fabricating material 410 atop the pattern 406. Again the process may be designed such that the non-patterned areas bond instead of the pattern. As shown, the workpiece substrate surface presents the surface chemistry pattern of activated regions X contrasting with passivated regions Y, where if the reagent is R it is selected such that $X+R \rightarrow XR$ is possible but $Y+R \rightarrow YR$ is not possible, providing covalent attachments only to the patterned regions.

Figure 3:
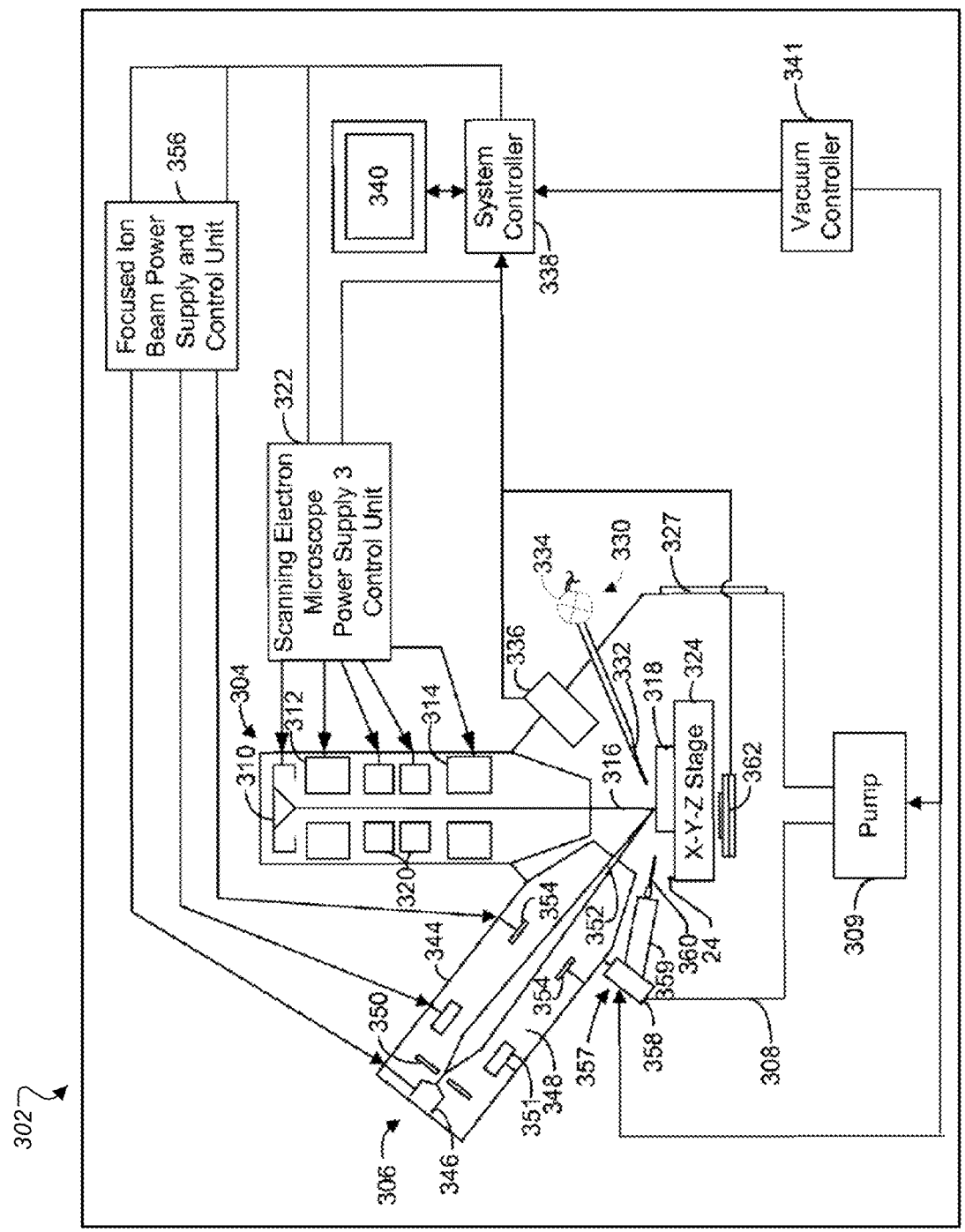
FIG. 3 is a schematic diagram of a one embodiment of an exemplary dual beam SEM/FIB system that is equipped to carry out methods according to the present invention.

FIG. 3 is a schematic diagram of a one embodiment of an exemplary dual beam SEM/FIB system 302 that is equipped to carry out methods according to the present invention. In some versions a dual beam system is not needed and only a SEM is required, if it has a suitable vacuum chamber with gas supply. Suitable dual beam systems are commercially available, for example, from FEI Company, Hillsboro, Oreg., the assignee of the present application. While an example of suitable hardware is provided below, the invention is not limited to being implemented in any particular type of dual beam device. The system controller 338 controls the operations of the various parts of dual beam system 302. Through system controller 338, a user can cause ion beam 352 or electron beam 316 to be scanned in a desired manner through commands entered into a conventional user interface (not shown). In the preferred embodiments herein, system controller 338 controls dual beam system 302 to perform the techniques discussed herein automatically or under control of technicians in accordance with programmed instructions.

Dual beam system 302 has a vertically mounted electron beam column 304 and a focused ion beam (FIB) column 306 mounted at an angle of approximately 52 degrees from the vertical on an evacuable specimen chamber 308. The specimen chamber may be evacuated by pump system 309, which typically includes one or more, or a combination of, a turbo-molecular pump, oil diffusion pumps, ion getter pumps, scroll pumps, or other known pumping means.

The electron beam column 304 includes an electron source 310, such as a Schottky emitter or a cold field emitter, for producing electrons, and electron-optical lenses 312 and 314 forming a finely focused beam of electrons 316. Electron source 310 is typically maintained at an electrical potential of between 500 V and 30 kV above the electrical potential of a work piece 318, which is typically maintained at ground potential.

Thus, electrons impact the work piece 318 at landing energies of approximately 500 eV to 30 keV. A negative electrical potential can be applied to the work piece to reduce the landing energy of the electrons, which reduces the interaction volume of the electrons with the work piece surface, thereby reducing the size of the nucleation site. Work piece 318 may comprise, for example, a semiconductor device, micro-electromechanical system (MEMS), or a lithography mask. The impact point of the beam of electrons 316 can be positioned on and scanned over the surface of a work piece 318 by means of deflection coils 320. Operation of lenses 312 and 314 and deflection coils 320 is controlled by scanning electron microscope power supply and control unit 322. Lenses and deflection unit may use electric fields, magnetic fields, or a combination thereof.

Work piece 318 is on movable stage 324 within specimen chamber 308. Stage 324 can preferably move in a horizontal plane (X and Y axes) and vertically (Z axis) and can tilt approximately sixty (60) degrees and rotate about the Z axis. A door 327 can be opened for inserting work piece 318 onto X-Y-Z stage 324 and also for servicing an internal gas supply reservoir (not shown), if one is used. The door is interlocked so that it cannot be opened if specimen chamber 308 is evacuated.

Mounted on the vacuum chamber are multiple gas injection systems (GIS) 330 (two shown). Each GIS comprises a reservoir (not shown) for holding the precursor or activation materials and a needle 332 for directing the gas to the surface of the work piece. Each GIS further comprises means 334 for regulating the supply of precursor material to the work piece. In this example the regulating means are depicted as an adjustable valve, but the regulating means could also comprise, for example, a regulated heater for heating the precursor material to control its vapor pressure.

When the electrons in the electron beam 316 strike work piece 318, secondary electrons, backscattered electrons, and Auger electrons are emitted and can be detected to form an image or to determine information about the work piece. Secondary electrons, for example, are detected by secondary electron detector 336, such as an Everhart-Thornley detector, or a semiconductor detector device capable of detecting low energy electrons. STEM detector 362, located beneath the TEM sample holder 318 and the stage 324, can collect electrons that are transmitted through a sample 318 mounted on the TEM sample holder 318. Signals from the detectors 336, 362 are provided to a system controller 338. Said controller 338 also controls the deflector signals, lenses, electron source, GIS, stage and pump, and other items of the instrument. Monitor 340 is used to display user controls and an image of the work piece using the signal The chamber 308 is evacuated by pump system 309 under the control of vacuum controller 341. The vacuum system provides within chamber 308 a vacuum of approximately $3 \times 10^{-6}$ mbar. When a suitable precursor or activator gas is introduced onto the sample surface, the chamber background pressure may rise, typically to about 5×10−5 mbar.

Focused ion beam column 306 comprises an upper neck portion 344 within which are located an ion source 346 and a focusing column 348 including extractor electrode 350 and an electrostatic optical system including an objective lens 351. Ion source 346 may comprise a liquid metal gallium ion source, a plasma ion source, a liquid metal alloy source, or any other type of ion source. The axis of focusing column 348 is tilted 52 degrees from the axis of the electron column. An ion beam 352 passes from ion source 346 through focusing column 348 and between electrostatic deflectors 354 toward work piece 318.

FIB power supply and control unit 356 provides an electrical potential at ion source 346. Ion source 346 is typically maintained at an electrical potential of between 1 kV and 60 kV above the electrical potential of the work piece, which is typically maintained at ground potential. Thus, ions impact the work piece at landing energies of approximately 1 keV to 60 keV. FIB power supply and control unit 356 is coupled to deflection plates 354 which can cause the ion beam to trace out a corresponding pattern on the upper surface of the work piece. In some systems, the deflection plates are placed before the final lens, as is well known in the art. Beam blanking electrodes (not shown) within ion beam focusing column 348 cause ion beam 352 to impact onto blanking aperture (not shown) instead of work piece 318 when a FIB power supply and control unit 356 applies a blanking voltage to the blanking electrode.

The ion source 346 typically provides a beam of singly charged positive gallium ions that can be focused into a sub one-tenth micrometer wide beam at work piece 318 for modifying the work piece 318 by ion milling, enhanced etch, material deposition, or for imaging the work piece 318.

A micromanipulator 357, such as the AutoProbe200™ from Omniprobe, Inc., Dallas, Tex., or the Model MM3A from Kleindiek Nanotechnik, Reutlingen, Germany, can precisely move objects within the vacuum chamber. Micromanipulator 357 may comprise precision electric motors 358 positioned outside the vacuum chamber to provide X, Y, Z, and theta control of a portion 359 positioned within the vacuum chamber. The micromanipulator 357 can be fitted with different end effectors such as thin probe 360.

It should be noted that FIG. 3 is a schematic representation, which does not include all the elements of a typical dual beam system for the sake of simplicity, and which does not reflect the actual appearance and size of, or the relationship between, all the elements.

Electron Beam Induced Oxidation of H-t Si

Figure 5:
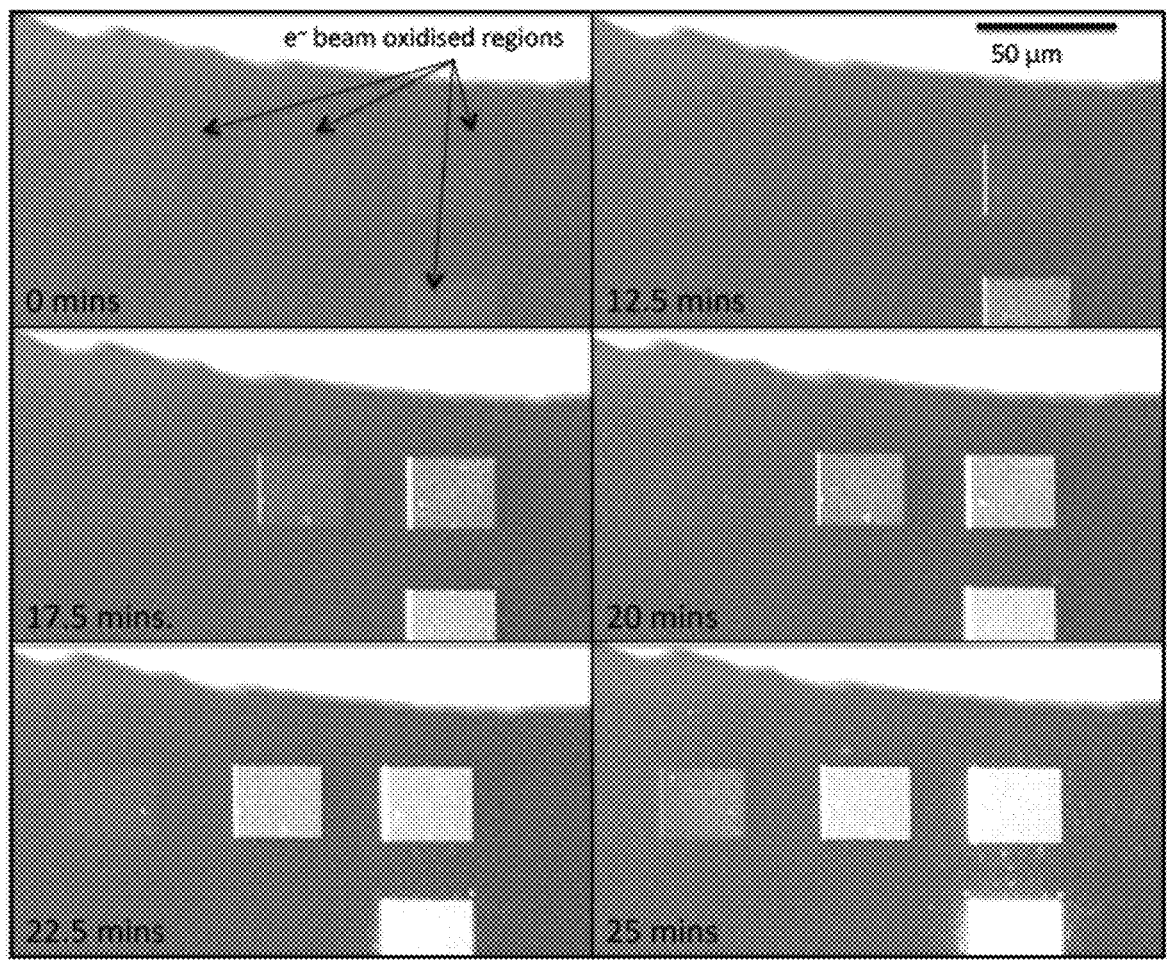
FIG. 5 is a sequential series of SEM images showing process results according to one embodiment performing localised CVD growth of tungsten.

FIG. 5 is a sequential series of SEM images showing process results according to one embodiment performing localised CVD growth of tungsten. This example process employs the SCDEBL processing scheme herein with electron beam induced oxidation of a hydrogen terminated Si (H-t Si) substrate. The first surface modification is the etching of the Si substrate with hydrofluoric (HF) acid. The HF treatment removes the native oxide ($SiO_X$) layer from the Si surface and leaves it terminated with an atomic layer of hydrogen. The H-t Si surface is less reactive than the $SiO_X$ surface and thus the HF treatment can be considered a global surface passivation treatment.

The images are a timed sequence of images from the material fabrication phase of the process, after the electron irradiation of the second surface modification, and show the fabrication process at 0 minutes, 12.5 minutes, 17.5 minutes, 20 minutes, 22.5 minutes, and 25 minutes. As can be seen there is localised CVD growth of tungsten from the precursor $W(CO)_6$ upon a H-t Si (111) surface. The rectangles are regions oxidised by electron irradiation in the presence of $O_2$ gas with increasing electron dosage clockwise from top left. W growth occurs much faster upon the $SiO_X$ surfaces relative to the H-t Si.

Figure 6:
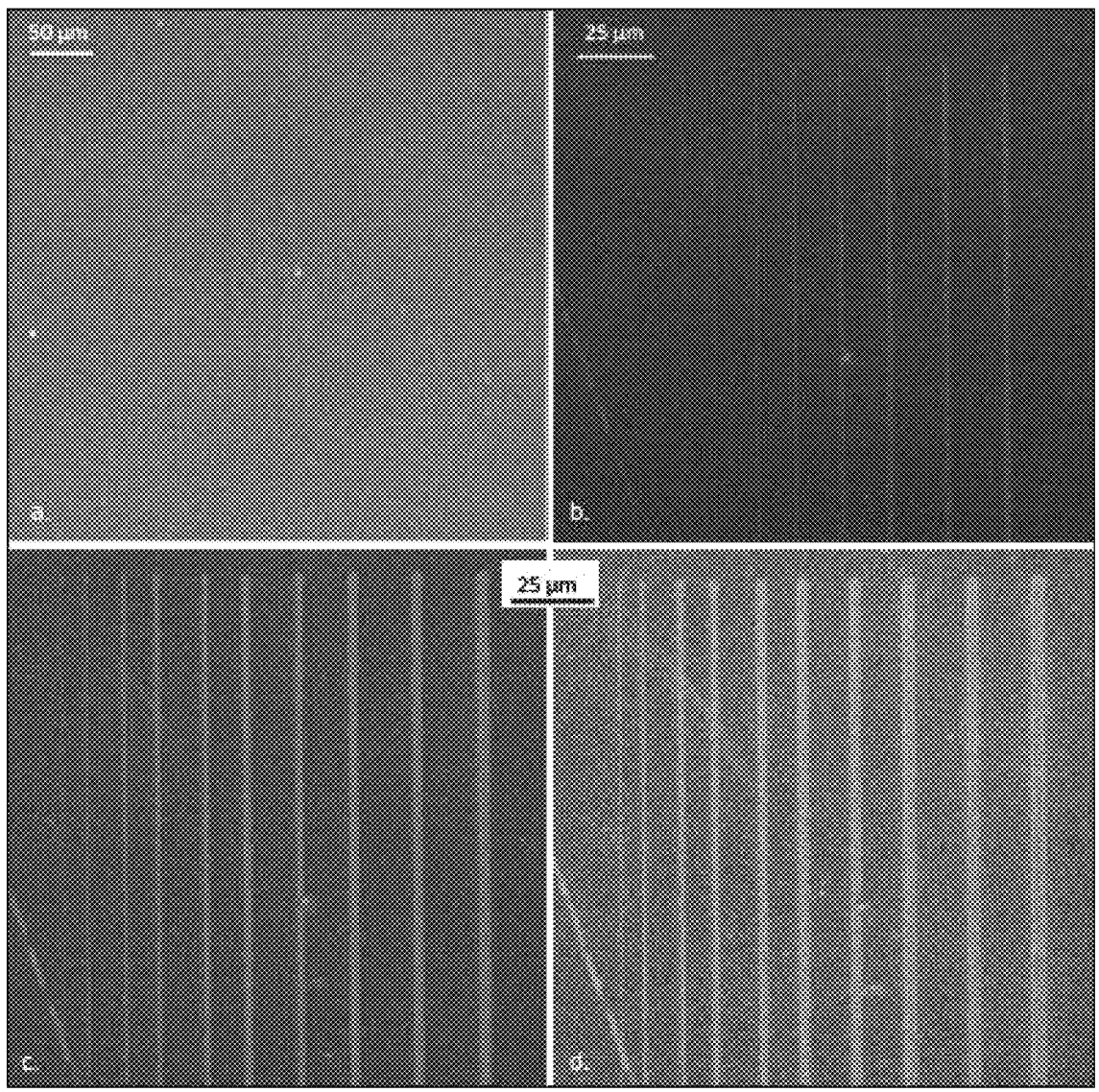
FIG. 6 is a series of images showing process results according to one embodiment performing localised CVD growth of gold (Au) lines.

FIG. 6 is a series of images showing process results according to one embodiment performing localised CVD growth of gold (Au) lines from the precursor $(CH_3)Au(acac)$ utilising the same SCDEBL system discussed with respect to FIG. 5. The four images are SEM images taken before (a) and at 15 minute (b-d) intervals during the CVD process, which is the material fabrication phase in this embodiment. The second workpiece surface modification is the localised selective electron beam induced oxidation of the H-t Si surface along the desired lines. In this technique, oxygen gas is injected into the scanning electron microscope (SEM) chamber, filling it to a set pressure. Electron irradiation then induces a reaction between adsorbed $O_2$ molecules and the H-t Si oxidising the surface only where the electron beam is scanned. This modification allows the subsequent localised CVD of tungsten (FIG. 5) and gold (FIG. 6) from the precursors $W(CO)_6$ and $(CH_3)_2Au(acac)$ respectively. Much faster CVD rates are observed upon the regions oxidised by the electron beam. Some CVD growth does occur upon the H-t Si surface. This is attributed to CVD nucleation at oxidised sites on the H-t Si surface. In this scenario, the H-t Si surface is unstable and has a proportion of oxidised surface sites. Therefore, it is preferable for the systems and processes herein to be implemented such that all process steps are performed in-situ without breaking vacuum.

Electron Beam Induced Etching of a-C

Figure 7:
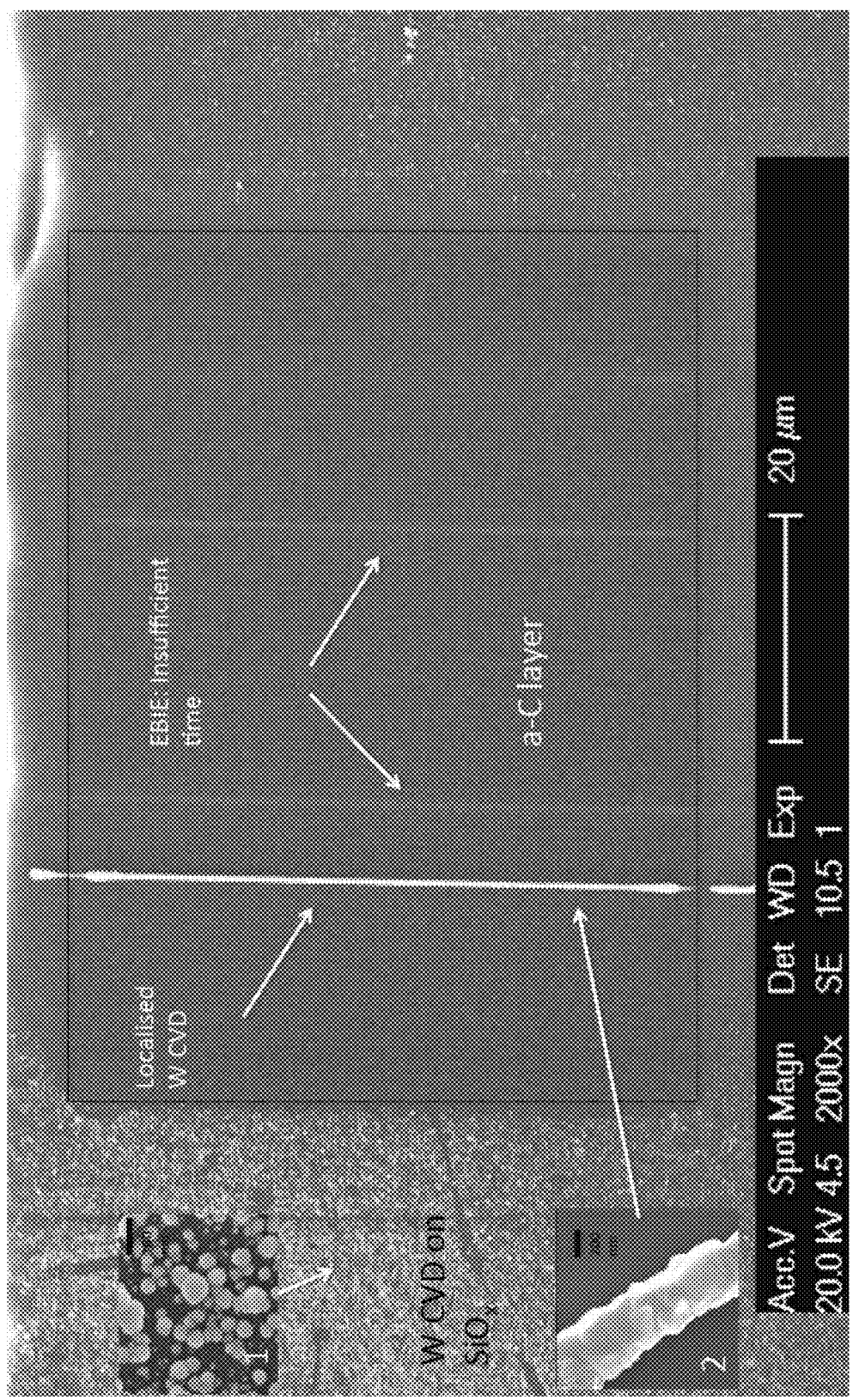
FIG. 7 is an SEM image showing process results according to one embodiment performing localised CVD of tungsten with a SCDEBL scheme utilising selective EBIE of an EBID a-C (amorphous carbon) thin layer.

FIG. 7 is an SEM image showing process results according to one embodiment performing localised CVD of tungsten with a SCDEBL scheme utilising selective EBIE of an EBID a-C (amorphous carbon) thin layer. The extent of the a-C layer is indicated by the black dashed rectangle. Inset on the left side are high magnification images of the microstructure of the tungsten deposited in the EBIE region versus the CVD growth outside the a-C layer upon $SiO_X$. No CVD growth occurs upon the unreactive a-C surface. Lines etched by EBIE for insufficient time which did not expose the underlying substrate are indicated.

This example SCDEBL system can be applied to almost any substrate. It can also be performed completely in-situ in a SEM without breaking vacuum. However it suffers from long processing time for each step. The first workpiece surface modification treatment consists of the deposition of a thin layer of amorphous carbon (a-C) by electron beam induced deposition (EBID). Residual organic molecules are typically present in any such high vacuum system in variable quantities. With sufficient electron irradiation, a surface chemistry altering layer of a-C can be deposited on any surface without the use of any specific precursor gas. An unreactive, diamond-like a-C layer results. The composition of this thin a-c layer varies little even with significantly different residual organic precursor molecules.

Electron beam induced etching (EBIE) using $H_2O$, $H_2O_2$ or $NH_3$ precursor can then be used to selectively etch away this a-C "pseudo resist" layer exposing the bare substrate. FIG. 7 shows results of this process for the localised CVD of tungsten from $W(CO)_6$. As observed, no CVD growth occurs upon the unreactive a-C layer. Outside the a-C layer can be seen the expected morphology of W deposited by CVD at this temperature (340° C.). A non-continuous film of semi-isolated tungsten crystallites (top left, inset 1) is formed by thermal CVD with $W(CO)_6$ at this temperature. This temperature represents the point at which the rate of thermal decomposition of W(CO)$_6$ begins to become significant upon hydroxylated SiO$_x$. The localised tungsten deposited in the region activated by EBIE is continuous and significantly different in morphology. This indicates that the EBIE process has an activation effect which cannot be explained by simple exposure of the underlying substrate.

EBID Surfaces

Another example of a SCDEBL process includes the use of seed layers deposited by EBID. Materials deposited by EBID using typical organometallic CVD precursors generally consist of nanocrystallites of the target metal dispersed amongst an a-C matrix. These materials are not suitable for applications requiring high material purity. However, freshly deposited EBID surfaces can provide a high energy surface which can catalyse subsequent material deposition processes.

Figure 8:
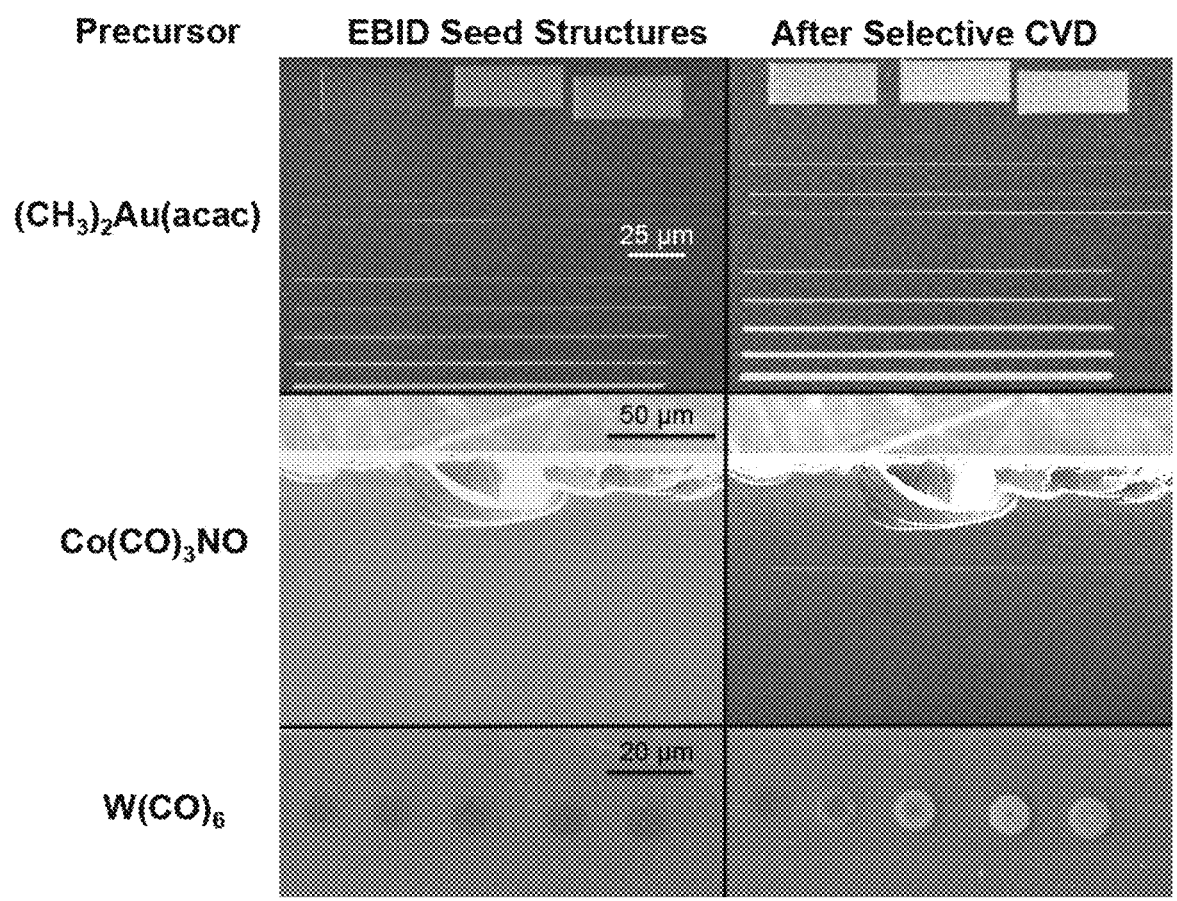
FIG. 8 shows an example of the use of EBID deposited surfaces to catalyse CVD reactions to deposit high purity material atop low purity EBID seeds.

FIG. 8 shows an example of the use of EBID deposited surfaces to catalyse CVD reactions to deposit high purity material atop low purity EBID seeds. A localised workpiece surface modification is performed by depositing EBID seeds at slightly elevated substrate temperature which is lower than the thermal decomposition point of the precursor. Selective CVD growth then occurs in the subsequent material fabrication stage only upon the EBID surfaces, within an appropriate temperature window for the same precursor which was used for EBID. Three different CVD precursors were used in the depicted images, and the results were similar for each case albeit with different temperature windows for selective CVD. From top to bottom are shown selective CVD growth of: Au, Co and W atop EBID deposited seed structures using the precursors (CH$_3$)$_2$Au(acac), Co(CO)$_3$NO, and W(CO)$_6$ respectively for both the EBID and CVD steps. CVD growth occurs only upon the EBID seeds within a limited substrate temperature window. The use of this process for localised CVD or ALD can be applied without a prior global substrate passivation step. However, for localised CVD the substrate temperature windows for which CVD growth remains localised can be very narrow without a prior passivation treatment. Preferably the first workpiece surface modification is performed as a substrate passivation treatment such as the formation of a passive self-assembled monolayer (SAM). Such a step may be used in some embodiments to increase the contrast between the surface chemistries of the active EBID surfaces and the substrate surface. This may increase the temperature window for localised CVD and the range of SC specific fabrication processes which could be applied.

SAM Pseudo-Resist Direct Electron Beam Chemical Lithography

The most versatile SCDEBL process, as presently understood among the embodiments herein, is the use of self-assembled monolayers (SAMs) as a "pseudo-resist" layer. The term pseudo-resist is used as the SAMs can act as a resist layer which is of only monolayer thickness and requires no removal step. As a first workpiece surface modification step, SAMs can be formed upon a range of substrates using different molecules and allow definition of a global surface chemistry for a substrate. They can achieve global passivation or activation with specific functional groups. In the second workpiece surface modification step, these SAMs can then be altered locally by direct electron beam induced precursor molecule mediated surface reactions (EBIE).

There is a wide range of possibilities for performing the first workpiece surface modification step, creating a global surface chemistry upon a substrate, using SAMs. SAMs can be formed upon a range of surfaces including most of the technologically relevant substrates such as silicon, gold, GaAs and Al$_2$O$_3$. A table summarizing some of the suitable molecules which can form self-assembled monolayers on silicon, silica and other oxide substrates may be found in the paper Nicole Herzer, Stephanie Hoeppener, and Ulrich S Schubert, "Fabrication of patterned silane based self-assembled monolayers by photolithography and surface reactions on silicon-oxide substrates," *Chemical Communications*, 46(31):5634-19, 2010. Global passivation, i.e. definition of an unreactive, low energy surface, is easily achievable with methyl- or CF$_3$-terminated SAMs. Surfaces of specific reactivity can be defined with SAM forming molecules terminated with a specific functional group. Some examples include amine-, thiol-, bromo- or chloro-terminated SAM forming molecules. For a review of some of global surface chemistries which can be defined with SAMs, see the paper Claudia Haensch, Stephanie Hoeppener, and Ulrich S Schubert, "Chemical modification of self-assembled silane based monolayers by surface reactions," *Chemical Society Reviews*, 39(6):2323-12, 2010. SAMs can also be prepared using molecules delivered from the gas phase. This ability allows for performing most or all of the processing steps herein (SAM formation, EBIE patterning, further covalent functionalization or localised CVD) in-situ without breaking vacuum.

Patterning of SAM surfaces has been done with a range of lithography techniques. Photo-lithography and electron beam-lithography amongst other techniques have been used to pattern SAMs. (See, for example, Herzer et al. and Rachel K Smith, Penelope A Lewis, and Paul S Weiss, "Patterning self-assembled monolayers," *Progress in Surface Science*, 75(1-2):1-68, June 2004.) However to the best of the present inventors' knowledge, none of these techniques are capable of matching the resolution capabilities of patterning SAMs using direct EBIE as described herein. Furthermore, other techniques (such as those found in the paper C. K. Harnett, K. M. Satyalakshmi, and H. G. Craighead, "Bioactive Templates Fabricated by Low-energy Electron Beam Lithography of Self-Assembled Monolayers," *Langmuir*, 17(1):178-182, January 2001) are capable of quite high resolution patterning of SAMs, such as focused ion beam (FIB) irradiation without a gas phase precursor, involve multiple steps—each of which sequentially reduce the effective resolution. The research in the Harnett et al. paper used conventional EBL to modify a passive SAM & demonstrate multi-step processing and covalent patterning and subsequent attachment of nanoparticles. It used electron irradiation of the SAM to reduce the molecules in the irradiated region to a-C or similar. It then used ozone cleaning which etches the irradiated regions faster than the rest of the SAM. Such two-step patterning presents a challenge as the SAM will also be damaged by the ozone treatment. As discussed, an important advantage of the techniques discussed herein is that the SAM patterning step is done by EBIE with a precursor gas for direct high-resolution etching of the SAM. This should lead to no delocalised damage of the SAM layer allowing much higher resolution SC patterning. It is also preferably done in a single step which can remain in-situ.

Figure 9A:
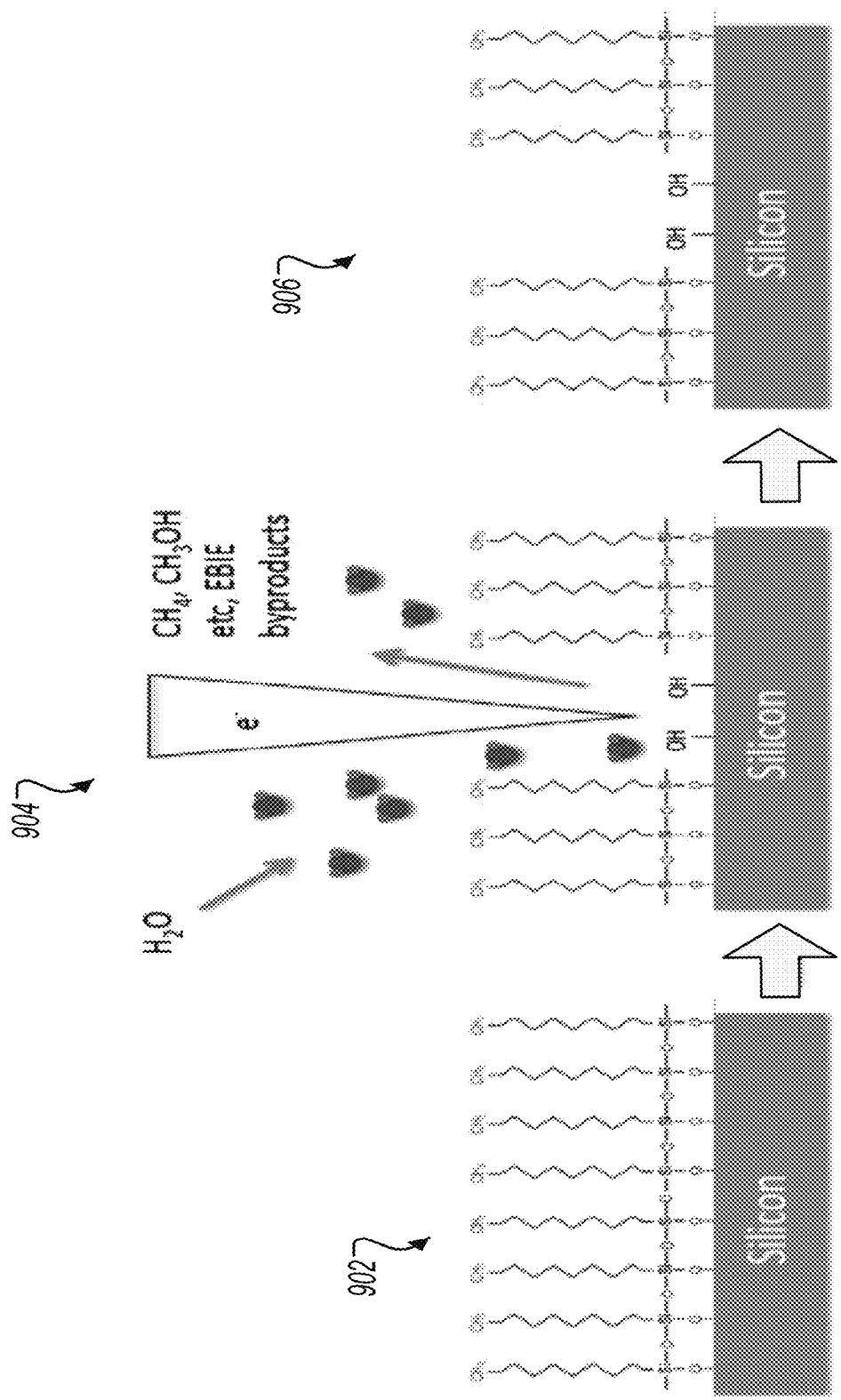
FIGS. 9A and 9B are cross sectional diagrams showing a processing scheme using SAMs as a pseudo-resist for high-resolution chemical lithography.
Figure 9B:
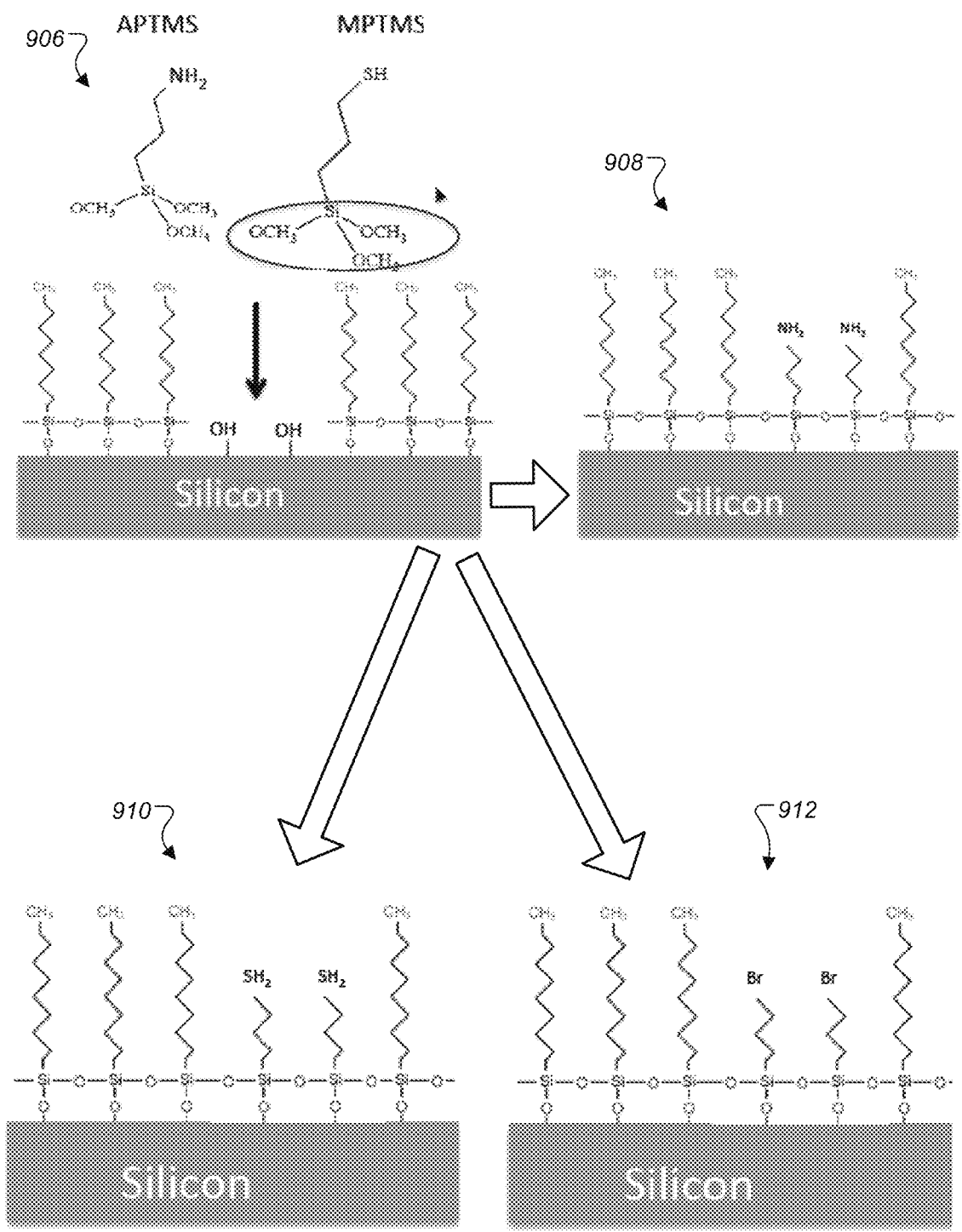

FIGS. 9A and 9B are cross sectional diagrams showing a processing scheme using SAMs as a pseudo-resist for high-resolution chemical lithography. In FIG. 9A, the process at diagram 902 forms a SAM upon a silicon substrate, setting a stable global surface chemistry, which in this case is a CH$_3$ SAM but may be any suitable SAM. Next at diagram 904, the process employs EBIE is to directly etch, selectively remove, and pattern the SAM with high resolution capabilities. In version, the etching is done with H$_2$O or NH$_3$, however this is not limiting and other versions may employ other suitable gasses depending on the application. The byproducts of the EBIE in this version are $CH_4$, $CH_3OH$, and others. The surface exposed by EBIE, shown at diagram 906, consists primarily of silanol (SiOH) sites which can be exploited for further covalent functionalisation using a wide range of trimethoxy- or trichloro-silane terminated molecules, as depicted by the three example scenarios shown in FIG. 9B. These molecules can be delivered to the site along the surface in solution or gas phase. Three examples of specifically functionalised patterned surface combinations attainable with this method are shown using alkoxy groups to form covalent bonds with the SiOH sites. The first combination uses 3-aminopropyltrimethoxysilane (APTMS) shown in the sequence from diagram 906 to diagram 908 bonding at the SiOH sites to present $NH_2$ at the bonded site. The second alternative depicted combination is the sequence from diagram 906 to diagram 910, using 3-mercaptopropyltrimethoxysilane (MPTMS). The resulting covalent bond presents $SH_2$ at the bonded site. The third depicted alternative is the sequence from diagram 906 to diagram 912, using 11-bromo undecyltrichlorosilane delivered to bond to the SiOH sites. The resulting fabrication shown in diagram 912 presents a layer of Br at the former SiOH sites.

It should be understood while these examples are shown, they are not limiting and many other combinations of SAM layers and reagents may be employed with the EBIE techniques discussed herein.

In the drawings and description herein, like parts are typically marked throughout the specification and drawings with the same reference numerals, respectively. In addition, similar reference numerals may refer to similar components in different embodiments disclosed herein. The drawing figures are not necessarily to scale. Certain features of the invention may be shown exaggerated in scale or in somewhat schematic form and some details of conventional elements may not be shown in the interest of clarity and conciseness. The present invention is susceptible to embodiments of different forms. Specific embodiments are described in detail and are shown in the drawings, with the understanding that the present disclosure is not intended to limit the invention to the embodiments illustrated and described herein. It is to be fully recognized that the different teachings of the embodiments discussed herein may be employed separately or in any suitable combination to produce desired results. The combinations of features described herein should not be interpreted to be limiting, and the features herein may be used in any working combination or sub-combination according to the invention. Further, the various novel workflow processes herein may be employed to improve prior art workflows, such as the processes described in the incorporated patent, and the description should be interpreted as supporting such an incorporation where fiducial location needs to be verified in a workflow, or where the SEM or FIB beam alignment needs to be verified. This description should therefore be interpreted as providing written support, under U.S. patent law and any relevant foreign patent laws, for any working combination or some sub-combination of the features herein.

In the description and claims, the terms "including" and "comprising" are used in an open-ended fashion, and thus should be interpreted to mean "including, but not limited to . . . ." To the extent that any term is not specially defined in this specification, the intent is that the term is to be given its plain and ordinary meaning. Furthermore, use of the term "and/or" herein shall be construed as an "inclusive" or, and not an "exclusive" or. For example, used herein the phrase "A and/or B" would mean "A, B, or A and B." As another example, used herein the phrase "A, B, and/or C" would mean "A, B, C, or any combination thereof." Further, whenever the terms "automatic," "automated," or similar terms are used herein, those terms will be understood to include manual initiation of the automatic or automated process or step.

The invention claimed is:

1. A method comprising:
    activating delocalized regions on a surface of a workpiece;
    passivating, by an electron beam in the presence of a precursor gas, localized regions on the surface of the workpiece; and
    affixing material to the activated delocalized regions on surface of the workpiece.

2. The method of any of claim 1, wherein activating delocalized regions on a surface of a workpiece surface includes modification in an in-situ process inside of a charged particle microscope, the charged particle microscope housing the electron beam and providing the precursor gas.

3. The method of any of claim 1, further comprising performing a first workpiece surface modification in an ex-situ process prior to loading the workpiece in a charged particle microscope, the charged particle microscope housing the electron beam and providing the precursor gas.

4. The method of claim 1, wherein affixing material to the activated delocalized regions on the surface of the workpiece includes depositing the material on the activated delocalized regions of the workpiece surface.

5. The method of claim 4, wherein depositing the material on the activated delocalized regions includes depositing the material on the activated delocalized regions by chemical vapor deposition.

6. The method of claim 4, wherein depositing on the activated delocalized regions includes depositing on the activated delocalized regions by a wet process.

7. The method of claim 1, wherein affixing material to the activated delocalized regions includes attaching nanoparticles.

8. The method of claim 1, wherein activating delocalized regions on a surface of a workpiece comprises forming a self-assembled monolayer on the surface.

9. The method of claim 1, wherein activating delocalized regions on a surface of a workpiece comprises modification of surface termination properties.

10. The method of claim 1, wherein passivating, by an electron beam in the presence of a precursor gas, localized regions on the surface of the workpiece comprises modification of surface termination properties.

* * * * *